US010609477B1

(12) United States Patent
Chadha et al.

(10) Patent No.: US 10,609,477 B1
(45) Date of Patent: Mar. 31, 2020

(54) CONTROL SYSTEM FOR REGULATION OF BOOSTED AUDIO AMPLIFIER

(71) Applicant: Texas Instruments Incorporated, Dallas, TX (US)

(72) Inventors: Jasjot Singh Chadha, Bangalore (IN); David Hernandez, Fort Worth, TX (US); Mukund Navada Kanyana, Bangalore (IN); Rejin Kanjavalappil Raveendranath, Kerala (IN); Sahiti Priya C, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/443,897

(22) Filed: Jun. 18, 2019

(30) Foreign Application Priority Data

Oct. 8, 2018 (IN) ............................ 201841038025

(51) Int. Cl.

| | |
|---|---|
| ***H04R 3/00*** | (2006.01) |
| ***H02M 3/00*** | (2006.01) |
| ***H03F 3/217*** | (2006.01) |
| ***H02M 3/158*** | (2006.01) |

(52) U.S. Cl.
CPC .............. *H04R 3/00* (2013.01); *H02M 3/158* (2013.01); *H03F 3/217* (2013.01)

(58) Field of Classification Search
CPC .......... H04R 3/00; H02M 3/00; H02M 3/158; H03F 2200/03; H03F 3/20; H03F 3/217; H03F 3/2175; H03F 3/2171; H03F 3/2173; H03F 1/0211; H03F 1/0216; H03F 1/0227; H03F 1/0233; H03G 3/007; G06F 1/26
See application file for complete search history.

(56) References Cited

U.S. PATENT DOCUMENTS 10,283,989 B1 * 5/2019 Hogan .................. H02J 7/0052
2013/0257533 A1 * 10/2013 Krabbenborg ............ G05F 5/00 330/251
2015/0030183 A1 * 1/2015 Pazhayaveetil ........ H03G 3/004 381/120
2015/0045095 A1 * 2/2015 D'Souza ................. H03F 3/187 455/572
2016/0126907 A1 * 5/2016 Moles ..................... H03F 3/217 330/251
2017/0063318 A1 * 3/2017 Pazhayaveetil ........ H03G 3/004
2017/0141743 A1 * 5/2017 Berkhout ........... G01R 31/2825
(Continued)

*Primary Examiner* — Thang V Tran
(74) *Attorney, Agent, or Firm* — John R. Pessetto; Charles A. Brill; Frank D. Cimino

(57) ABSTRACT

A boosted audio amplifier system includes a first digital interpolation filter configured to oversample an audio input signal at a first oversampling rate and includes a signal level detector having an input coupled to receive the oversampled audio input signal and configured to produce an audio input level signal. The system further includes a programmable delay buffer having inputs coupled to receive the oversampled audio input signal and a first delay signal. The programmable delay buffer adds a first delay to the oversampled audio input signal to produce a delayed input signal. The system also includes a first processor having inputs coupled to receive a battery voltage level signal, the audio input level signal and the first delay signal. The first processor is configured to produce boost control signals to regulate a boost voltage.

21 Claims, 5 Drawing Sheets

(56) References Cited

U.S. PATENT DOCUMENTS

| | | | | |
|---|---|---|---|---|
| 2017/0142518 | A1* | 5/2017 | May | H04R 3/04 |
| 2018/0337637 | A1* | 11/2018 | Galal | H03F 1/0216 |
| 2018/0358945 | A1* | 12/2018 | Lindemann | H03G 3/3005 |
| 2019/0007008 | A1* | 1/2019 | Berkhout | H03K 7/08 |
| 2019/0131931 | A1* | 5/2019 | van Dommelen | H03F 3/217 |

* cited by examiner

CONTROL SYSTEM FOR REGULATION OF BOOSTED AUDIO AMPLIFIER

CROSS REFERENCE TO RELATED APPLICATIONS

This application claims priority from Indian provisional application No. 201841038025, filed Oct. 8, 2018, entitled "CLASS-H CONTROL FOR SUPPLY TRACKING IN BOOSTED CLASS-D AMPLIFIER", assigned to the present assignee and incorporated herein by reference.

BACKGROUND

The disclosure relates generally to audio amplifiers, and more particularly to control systems for regulation of boosted audio amplifiers.

DESCRIPTION OF THE RELATED ART

In battery powered audio devices, audio amplifiers are generally used to amplify and reproduce audio input signals. Due to limited voltage supply available from typical batteries, a DC-DC boost converter is usually used to boost the battery voltage to a higher voltage level to power an audio amplifier. In order to prevent voltage clipping of the audio amplifier output, the DC-DC boost converter is regulated so the output voltage of the DC-DC boost converter is higher than the audio signal level. To improve efficiency, the DC-DC boost converter supply voltage also tracks the audio input signal. Current systems track only low frequency input signals over a limited range (e.g., up to 100 Hz). For higher frequency input signals (e.g., 1 KHz), current systems are unable to track the input signal, thereby resulting in output voltage clipping and lower efficiency. Accordingly, improvements in boosted audio amplifier systems are needed.

SUMMARY

Various aspects of the present disclosure are directed to control systems configured to regulate boosted audio amplifiers. In one aspect, a boosted audio amplifier system includes a first digital interpolation filter configured to oversample an audio input signal at a first oversampling rate. The system further includes a signal level detector having an input coupled to receive the oversampled audio input signal and configured to produce an audio input level signal. The system also includes a programmable delay buffer having inputs coupled to receive the oversampled audio input signal and a first delay signal. The programmable delay buffer adds a first delay to the oversampled audio input signal and produces a delayed input signal. The system also includes a first processor having inputs coupled to receive a battery voltage level signal, the audio input level signal and the first delay signal. The first processor is configured to produce one or more boost control signals to regulate a boost voltage. The system also includes a digital to analog converter having an input coupled to receive the delayed input signal and configured to produce a first analog signal. The system also includes an amplifier having inputs coupled to receive the regulated boost voltage and the first analog signal and operable to produce an audio output signal. The system also includes a DC-DC boost converter having inputs coupled to receive the battery voltage and the boost control signals. The boost control signals vary the duty cycle D of a pulse width modulated (PWM) switching signal applied to the DC-DC boost converter to regulate the boost voltage. The system also includes a low pass filter having inputs coupled to receive the boost control signals and having outputs coupled to the inputs of the DC-DC boost converter. The low pass filter is configured to filter the boost control signals prior to being applied to the inputs of the DC-DC boost converter. The system also includes an output capacitor coupled between an output of the DC-DC boost converter and ground.

In an additional aspect of the disclosure, the system includes a second processor having inputs coupled to receive N input signals, and is operable to produce the first delay signal. The N input signals include at least one of output capacitance, input sample rate, maximum boost level, load resistance, inductor saturation current, and DC-DC boost converters's current limit.

In an additional aspect of the disclosure, the first processor includes a non-transitory computer-readable medium having program code recorded thereon to execute a Class-H Control Algorithm to determine the boost control signals to regulate the boost voltage.

In an additional aspect of the disclosure, the second processor is configured to produce a battery voltage minimum threshold signal responsive to the N input signals. The first processor has an input coupled to receive the battery voltage minimum threshold signal and in response disable class-H operation to avoid voltage clipping below a minimum threshold.

In an additional aspect of the disclosure, a boosted audio amplifier system includes a first digital interpolation filter configured to oversample an audio input signal at a first oversampling rate. The system further includes a signal level detector having an input coupled to receive the oversampled audio input signal and configured to produce an audio input level signal. The system also includes a programmable delay buffer having inputs coupled to receive the oversampled audio input signal and a first delay signal. The programmable delay buffer is configured to add a first delay to the oversampled audio input signal to produce a delayed input signal. The system also includes a first processor having inputs coupled to receive a battery voltage level signal, the audio input level signal and the first delay signal. The first processor is configured to produce boost control signals to regulate a boost voltage. The system also includes a second processor having inputs coupled to receive N input signals and operable to produce the first delay signal. The system also includes a second digital interpolation filter having an input coupled to receive the delayed input signal. The second digital interpolation filter is configured to oversample the delayed input signal at a second oversampling rate. The system also includes a digital to analog converter having an input coupled to receive the oversampled signal produced by the second digital interpolation filter, and configured to produce a first analog signal. The system also includes a DC-DC boost converter having inputs coupled to receive the battery voltage and the boost control signals and operable to regulate the boost voltage. The system also includes an amplifier having inputs coupled to receive the regulated boost voltage and the first analog signal and operable to produce an audio output signal. The system also includes a low pass filter having inputs coupled to receive the boost control signals and configured to filter the boost control signals prior to being applied to the inputs of the DC-DC boost converter.

DETAILED DESCRIPTION

Figure 1:
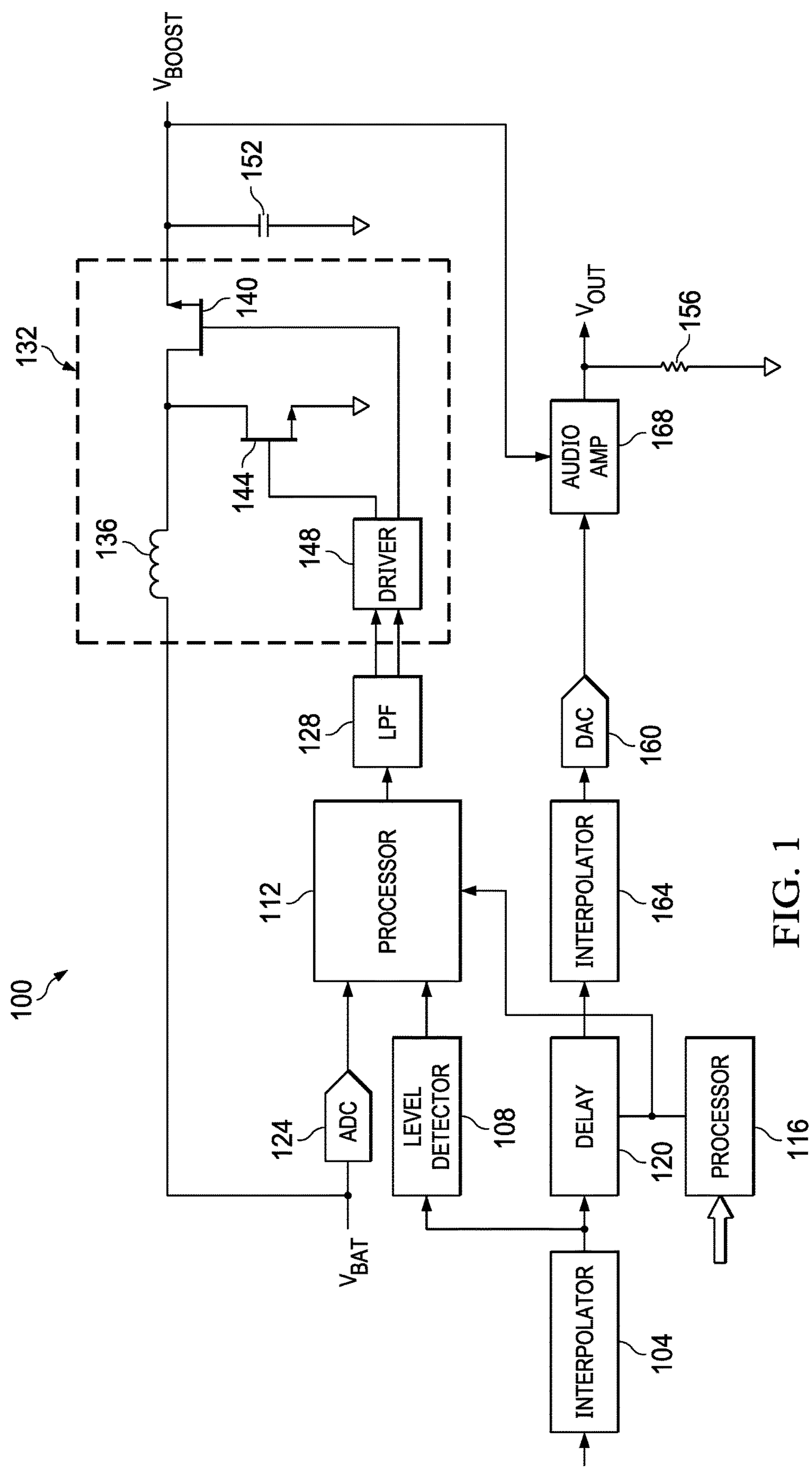
FIG. 1 illustrates a boosted audio amplifier system in accordance with embodiments of the disclosure.

FIG. 1 illustrates a boosted audio amplifier system 100 in accordance with embodiments of the disclosure. The boosted audio amplifier system 100 provides a regulated boost voltage to an amplifier, such as, for example, a Class-D amplifier.

Referring to FIG. 1, the amplifier system 100 includes a first digital interpolation filter 104 having an input coupled to receive a digital audio input signal. The digital audio input signal may be received at a rate of 48K samples/second, for example. The first digital interpolation filter 104 may be clocked at an oversampling frequency of K×48K. The first digital interpolation filter 104 oversamples the input signal by a factor K (e.g., K=2) by inserting extra data points.

A signal level detector 108 has an input coupled to receive the oversampled audio input signal. The signal level detector 108 detects the audio input signal level and produces an audio input level signal corresponding to the detected level.

The amplifier system 100 includes a first processor 112 having a first input coupled to receive a battery voltage level signal, a second input coupled to receive the audio input level signal, and a third input coupled to receive a first delay signal.

Responsive to the inputs, the first processor 112 produces one or more boost control signals. In some embodiments, the first processor 112 may also receive a battery voltage minimum threshold signal, which is used to disable class-H operation of the amplifier system 100 below a minimum threshold to avoid voltage clipping. The first processor 112 may include a non-transitory computer-readable medium having program code recorded thereon to execute instructions for a Class-H Control Algorithm which determines first and second boost control signals.

The amplifier system 100 includes a second processor 116 which receives N input signals. The N input signals may include at least one of the following: output capacitance, input sample rate, maximum boost level, load resistance, inductor saturation current, and DC-DC boost converter current limit. According to some embodiments, the second processor 116 may be implemented in a graphical user interface (GUI) configured to receive and process the N input signals. The second processor 116, responsive to the N input signals, produces a first delay signal corresponding to a first delay or latency to be added to the signal path. The second processor 116 may also compute the battery voltage minimum threshold which may be used to disable class-H operation of the amplifier system 100. The second processor 116 may include a non-transitory computer-readable medium having program code recorded thereon to execute instructions to produce the first delay signal.

A programmable delay buffer 120 has a first input coupled to receive the oversampled audio input signal and a second input coupled to receive the first delay signal. The programmable delay buffer 120 adds the first delay to the oversampled audio input signal and produces a delayed input signal. Thus, the programmable delay buffer 120 adds latency to the signal path by adding the first delay. The first delay added to the signal path varies depending on the first delay signal.

The amplifier system 100 includes an analog to digital converter 124 which receives a battery voltage Vbat. Responsive to the battery voltage Vbat, the analog to digital converter 124 produces the battery voltage signal level which is applied to one of the inputs of the first processor 112.

The amplifier system 100 includes a DC-DC boost converter 132 coupled to receive the battery voltage Vbat and the boost control signals. The DC-DC boost converter 132 produces a regulated boost voltage. The boost converter 132 comprises an inductor 136 coupled between the battery voltage Vbat and a switching transistor 140. Another switching transistor 144 has its drain terminal connected to the anode of the diode 140 and has its source connected to ground. A driver circuit 148 has a first input coupled to receive a first boost control signal and has a second input coupled to receive a second boost control signal. The driver circuit 148 produces a first pulse width modulated (PWM) signal which is applied to the gate of the switching transistor 144. The driver circuit 148 also produces a second signal for controlling the operation of the switching transistor 140. An output capacitor 152 is coupled between the output of the DC-DC boost converter 132 and ground.

The switching transistor 144 is controlled by the first PWM signal. When the first PWM signal is high, the switching transistor 144 is turned ON and when the PWM signal is low, the switching transistor 144 is turned OFF. The duty cycle D of the PWM signal determines the conduction time of the switching transistor 144. A low pass filter 128 has a first input coupled to the outputs of the first processor 112 to filter the boost control signals prior to being applied to the DC-DC converter 132. The low pass filter 128 minimizes sudden changes in duty cycle, thus ensuring a smooth output voltage transition.

According to embodiments of the disclosure, the first boost control signal is used to turn ON/OFF the DC-DC boost converter 132, and the second boost control signal is used to regulate the boost voltage level. The second boost control signal may vary the duty cycle D of the PWM signal to regulate the boost voltage.

Consider, for example, the first boost control signal turns ON the DC-DC boost converter 132. When the first PWM signal is high, current flows through the channel of the switching transistor 144, resulting in an increase in the current flowing through the inductor 136. When the PWM signal is low, current does not flow through the switching transistor 144, and the only path offered to the inductor current is through the switching transistor 140 into the output capacitor 152 and a load resistor 156. The switching transistor 140 is turned ON/OFF in a manner to allow the inductor current to flow therethrough into the output capacitor 152 when the switching transistor 144 is turned OFF. This results in transferring energy accumulated in the inductor 136 into the capacitor 152.

Variations to the amplifier system 100 are possible within the scope of the disclosure. For example, the switching transistor 140 could be replaced by a diode which allows current to flow through to charge the capacitor 152 when the switching transistor 144 is turned OFF. The regulated boost voltage Vboost can be expressed by the following relation:

$$Vboost=Vbat*1/(1-D)$$

Thus, the boost voltage Vboost is regulated by varying the duty cycle D.

The amplifier system 100 includes a digital to analog converter 160 having an input coupled to receive the delayed input signal. The digital to analog converter 160 converts the delayed input signal to a first analog signal.

In some embodiments, a second interpolation filter 164 may be added to the signal path to further oversample the data for additional accuracy. For example, the second interpolation filter 164 may oversample the data by a factor K2, where K2 may be 4.

The amplifier system 100 includes an audio amplifier 168 powered by the regulated boost voltage. The audio amplifier 168 has an input coupled to receive the first analog signal. The audio amplifier 168 amplifies the first analog signal and produces an audio output signal. The audio amplifier 168 may be a Class-D amplifier. In some embodiments, other types or classes of amplifiers may be used instead of the Class-D amplifier. The boost converter 132 regulates the boost voltage Vboost so that Vboost remains at least at a required minimum level to prevent the audio amplifier 168 output from being clipped. In order to prevent the output of the audio amplifier 168 from being clipped, the boost voltage Vboost must be greater than the audio input signal.

Referring to FIG. 1, the boost converter 132 charges the capacitor 152 to regulate the boost voltage Vboost at the desired level, i.e, greater than the audio input signal. Depending on the capacitance value, the capacitor 152 requires a certain amount of time to be charged to the desired level. Thus, if the audio amplifier 168 receives and amplifies the first analog signal before the capacitor 152 is charged to the desired level, the output of the amplifier 168 will be clipped. According to embodiments of the disclosure, the signal level detector 108 produces the audio input level signal responsive to the oversampled audio input signal. The audio input level signal is applied to one of the inputs of the first processor 112 which executes a Class-H algorithm to produce the first boost control signal to turn ON/OFF the boost converter 132 and the second boost control signal to regulate the boost voltage Vboost at a minimum level to reproduce the audio output signal without voltage clipping. The first boost control signal may turn OFF the boost converter 132 if the output signal is below the battery voltage Vbat.

Furthermore, the second processor 116 produces the delay signal which is applied to the programmable delay buffer 120 to introduce a delay or latency to the signal path to ensure that the first analog signal is not applied to the input of the audio amplifier 168 prior to the capacitor 152 being charged to a desired level. The delay added to the signal path allows the boost converter 132 to charge the capacitor 152 to a desired level prior to the audio amplifier 168 receiving and amplifying the first analog signal. Thus, the audio amplifier 168 is able to reproduce the audio output signal without voltage clipping.

According to disclosed embodiments, the amount of delay or latency added to the signal path varies depending on one or more of the following: the audio input signal level, the capacitance value of the output capacitor 152, the load resistor 156, the current limit Ilim, saturation current Isat, inductor L, and maximum boost voltage level. For example, if Ilim is low due to battery constraints, the delay may be increased to allow more time to charge the output capacitor 152 to the desired level. Thus, the second processor 116 and the programmable delay buffer 120 allow selection of an optimum delay or latency depending on conditions.

Figure 2:
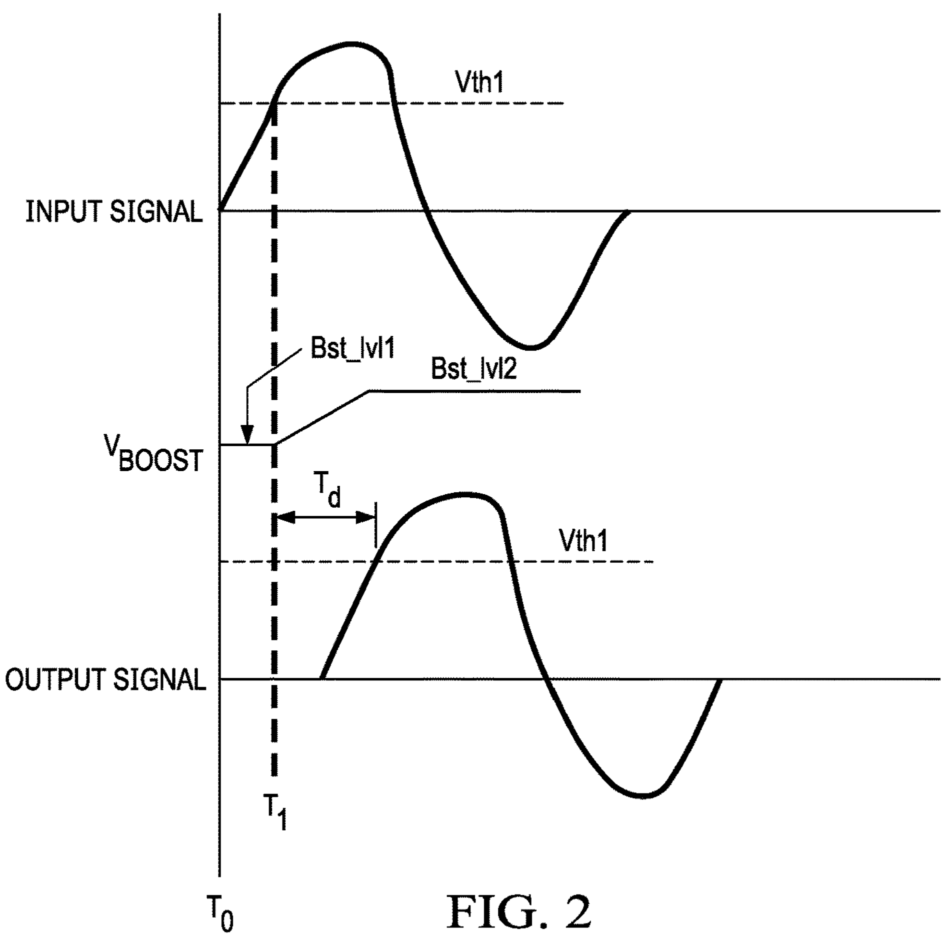
FIG. 2 illustrates waveforms of input signal, boost voltage and output signal.

FIG. 2 illustrates waveforms of signals received and produced by the amplifier system 100. At time T0, an audio input signal arrives at the first digital interpolator 104. At time T0, the boost voltage Vboost is at level 1. At time T1, the audio input signal crosses a threshold Vth1, and in response, the boost converter 132 charges the output capacitor 152 to ramp up the boost voltage Vboost to level 2. To allow adequate time to charge the output capacitor 152, a delay Td is added to the signal path. Thus, the amplifier 168 is able to produce the output signal without clipping.

Figure 3:
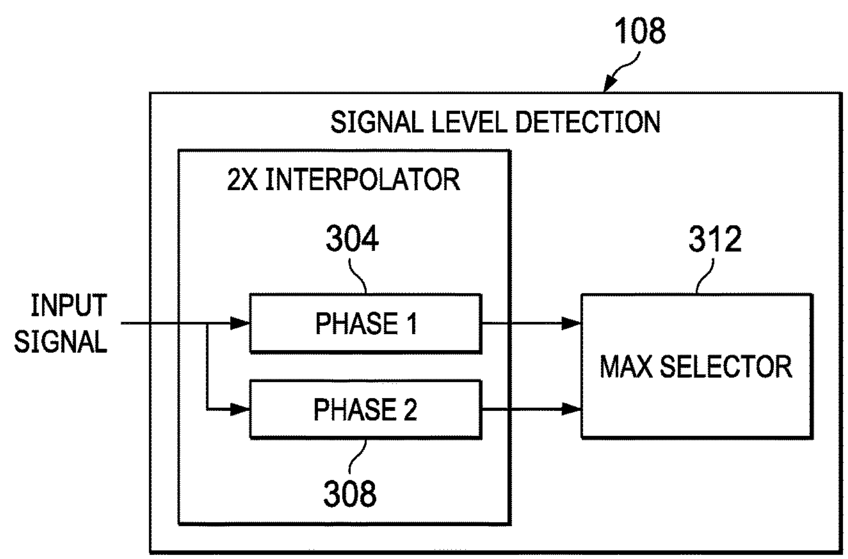
FIGS. 3 and 4 illustrate a signal level detector and interpolated waveform.

FIG. 3 illustrates the signal level detector 108 according to an embodiment. The signal level detector 108 comprises two phases: phase1 304 and phase2 308. The signal level detector 108 has an input coupled to receive the oversampled input signal from the first interpolation filter 104. Consider, for example, the audio input signal is 2× oversampled by the first interpolation filter 104. Thus, the first interpolation filter 104 inserts one sample between two original samples. Phase1 304 detects the original samples (i.e., sample #1, sample #3, sample #5 . . . ) while the Phase2 308 detects the inserted samples (i.e., sample #2, sample #4, sample #6 . . . ). A max selector 312 selects the higher value from each pair of samples from Phase1 304 and Phase2 308. Thus, the max selector 312 functions as 2× downsampler and selects the higher of the two values. The first processor 112 receives the output of the max selector 312 and executes a Class-H algorithm as discussed before.

Figure 4:
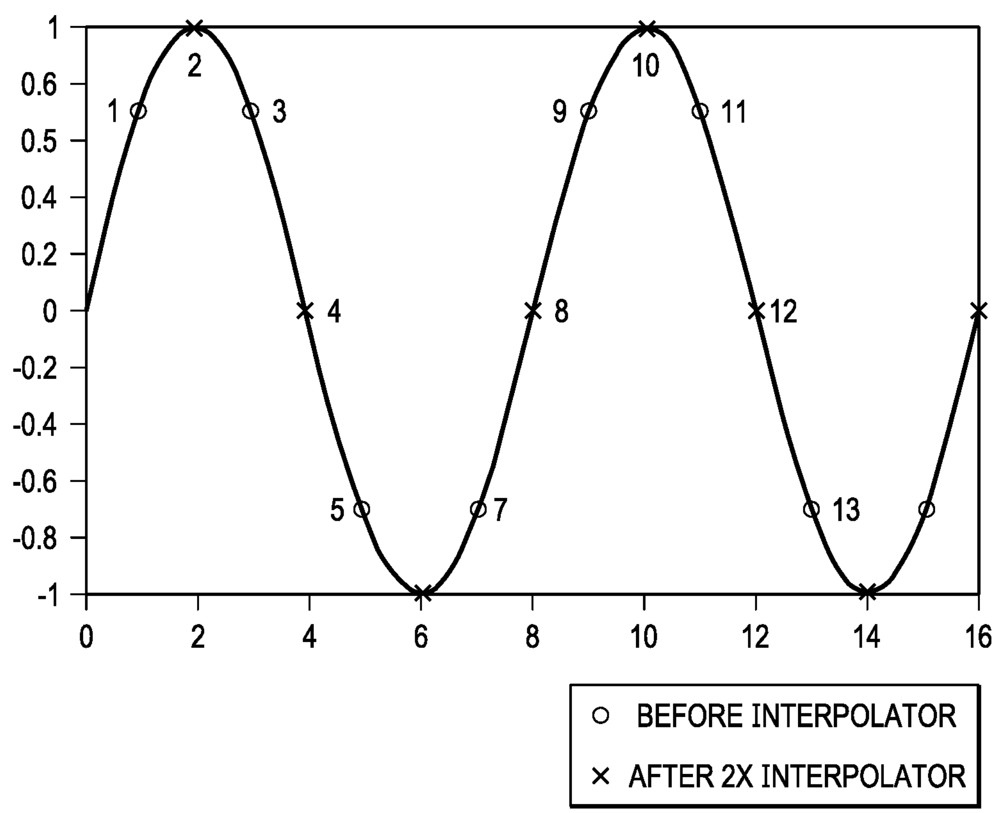

FIG. 4 illustrates an interpolated waveform in accordance with disclosed embodiments. Prior to interpolation, the original audio input signal consists of odd numbered samples (i.e., sample #1, sample #3, sample #5, sample #7 . . . ). The first interpolation filter 104 inserts one sample between two original samples. The first interpolation filter 104 inserts even numbered samples (i.e., sample #2, sample #4, sample #6, sample #8 . . . ), and the oversampled signal is filtered. As shown, 2× interpolation allows detection of signal peaks at sample #2, sample #6, sample #10 and sample #14.

Figure 5:
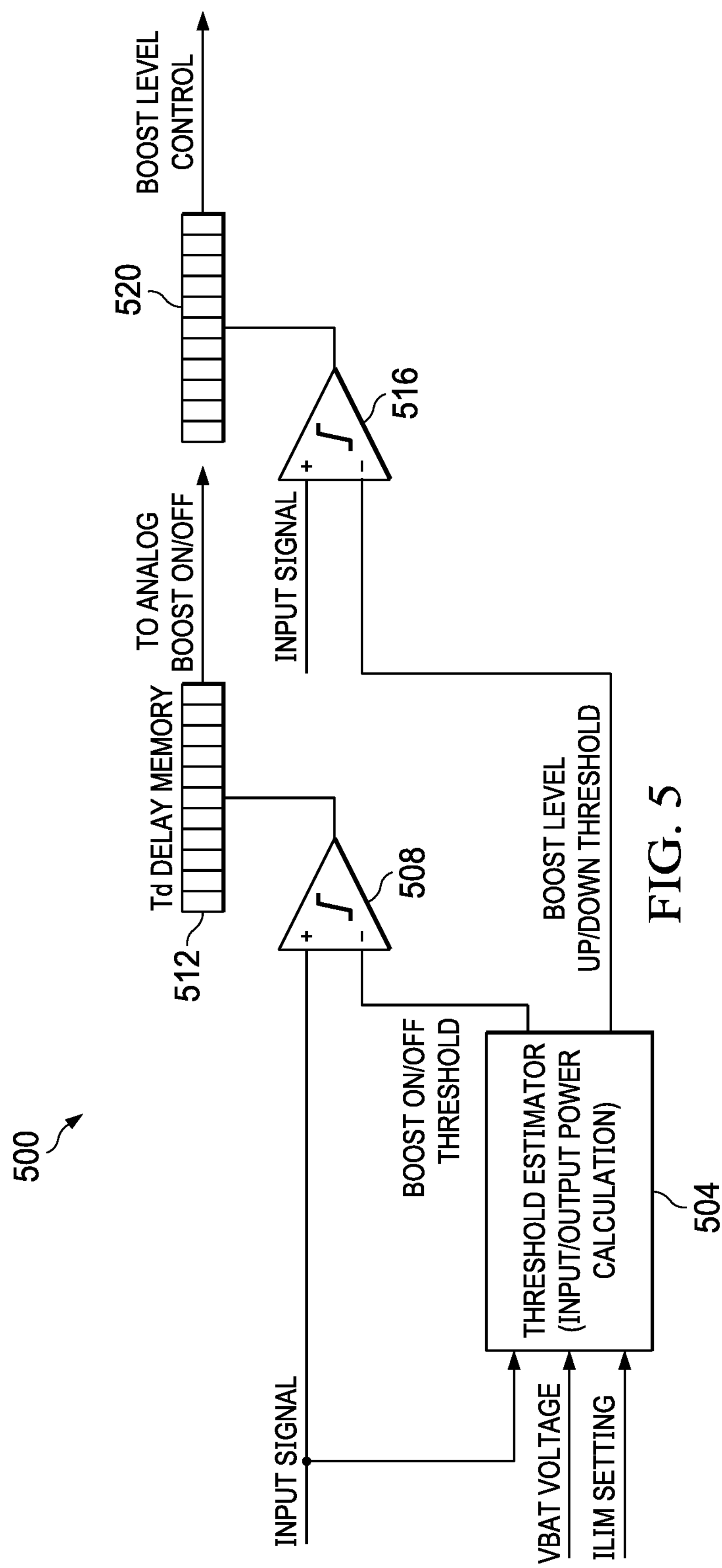
FIG. 5 illustrates a system in accordance with embodiments of the disclosure.

FIG. 5 illustrates a block diagram of a system 500 which generates boost ON/OFF and boost level UP/DOWN signals to control the operation of a DC-DC boost converter (not shown in FIG. 5). A threshold estimator 504 has inputs coupled to receive an audio input signal, a battery voltage Vbat and a limit current Ilim. In response, the threshold estimator 504 produces a boost ON/OFF threshold signal and a boost level UP/DOWN threshold signal.

A first comparator circuit 508 compares the audio input signal and the boost ON/OFF threshold signal. When the audio input signal crosses the boost ON/OFF threshold, the first comparator circuit 508 produces the boost ON/OFF signal which is stored in a first memory location 512. A second comparator circuit 516 has inputs coupled to receive the audio input signal and the boost level UP/DOWN threshold signal. When the audio input signal crosses the boost level UP/DOWN threshold signal, the second comparator circuit 516 produces the boost level UP/DOWN signal which is stored in a second memory location 520. Thus, when the audio signal crosses a given threshold, the outputs of the first and second comparator circuits 508 and 516 are stored in memory locations.

According to some embodiments, the boost level UP and the boost ON signals are sent instantaneously to the DC-DC boost converter. Thus, when the audio input signal rises and crosses the thresholds, the DC-DC boost converter is turned ON and is ramped up to the desired level. However, the boost level Down and the boost OFF signals are not instantaneously applied to the DC-DC boost converter. Only after a predetermined delay period Td, the boost level Down and the boost OFF signals are applied to the DC-DC converter, which ensures that the audio input signal remains below the threshold signals for at least predetermined time period.

Figure 6A:
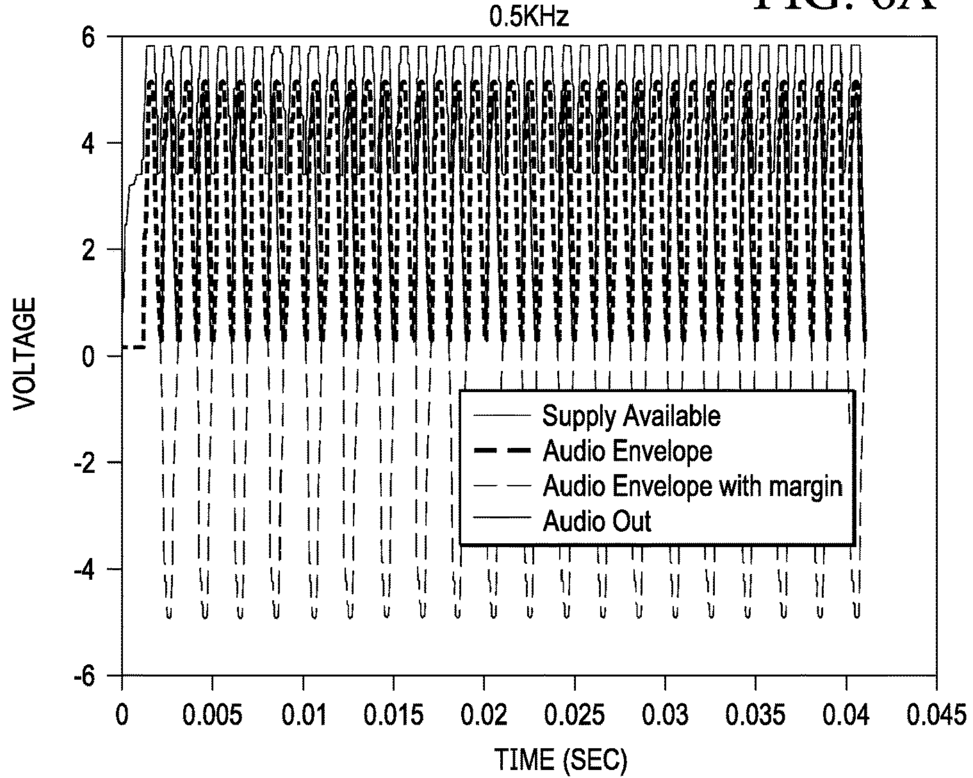
FIGS. 6A and 6B illustrate waveforms of signals produced by the audio amplifier system.
Figure 6B:
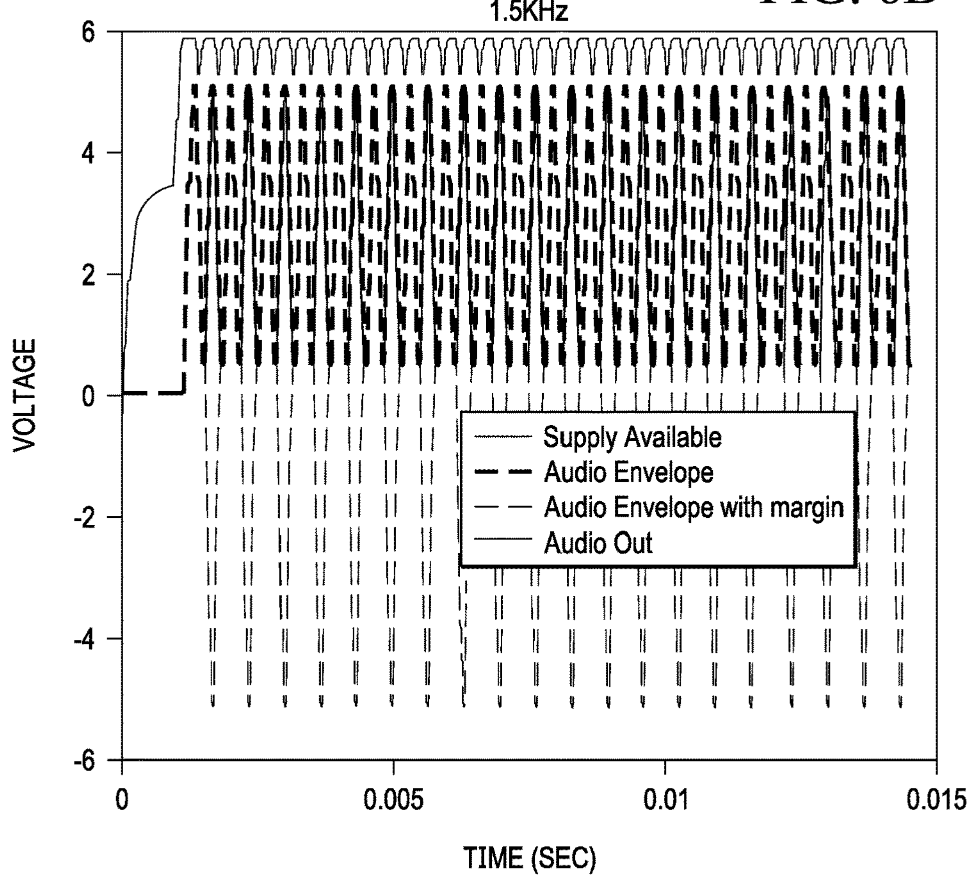

FIGS. 6A and 6B illustrate waveforms of signals produced by the audio amplifier system 100. In FIG. 6A, the boost voltage tracks the audio input signal at 0.5 KHz, and in FIG. 6B, the boost voltage tracks the audio input signal at 1.5 KHz. Thus, the audio amplifier system 100 tracks the input voltage up to 1.5 KHz.

In some embodiments, the boosted audio amplifier system 100 can be implemented in an integrated circuit (IC) or in an application-specific integrated circuit (ASIC) system-on-a-chip (SoC). In other embodiments, the amplifier system 100 can be implemented with discrete components. In yet other embodiments, only some parts of the boosted amplifier system 100 are implemented in an IC. Referring to the boosted amplifier system 100, the DC-DC boost converter 132, the low pass filter 128 and the output capacitor 152 may be implemented using discrete components while the remaining parts of the boosted amplifier system 100 may be implemented in an IC.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A boosted audio amplifier system comprising:

a first digital interpolation filter configured to oversample an audio input signal at a first oversampling rate;

a signal level detector having an input coupled to receive the oversampled audio input signal and configured to produce an audio input level signal;

a programmable delay buffer having inputs coupled to receive the oversampled audio input signal and a first delay signal and configured to add a first delay to the oversampled audio input signal to produce a delayed input signal;

a first processor having inputs coupled to receive a battery voltage level signal, the audio input level signal and the first delay signal and configured to produce boost control signals to regulate a boost voltage;

a digital to analog converter having an input coupled to receive the delayed input signal and configured to produce a first analog signal; and an amplifier having inputs coupled to receive the regulated boost voltage and the first analog signal and operable to produce an audio output signal.

2. The boosted amplifier system of claim 1 further comprising a DC-DC boost converter having inputs coupled to receive the battery voltage and the boost control signals, wherein the boost control signals vary the duty cycle D of a pulse width modulated (PWM) switching signal applied to the DC-DC boost converter to regulate the boost voltage.

3. The boosted audio amplifier system of claim 2 further comprising:

a low pass filter having inputs coupled to receive the boost control signals and having outputs coupled to the inputs of the DC-DC boost converter, the low pass filter configured to filter the boost control signals prior to being applied to the inputs of the DC-DC boost converter; and an output capacitor coupled between an output of the DC-DC boost converter and ground.

4. The boosted audio amplifier system of claim 2, wherein the DC-DC boost converter, responsive to the boost control signals, maintains the regulated boost voltage at least a minimum boost voltage level required to prevent the audio output signal from being clipped.

5. The boosted audio amplifier system of claim 1, wherein the first processor includes a non-transitory computer-readable medium having program code recorded thereon to execute a Class-H Control Algorithm to determine the boost control signals to regulate the boost voltage.

6. The boosted amplifier system of claim 1 further comprising a second processor having inputs coupled to receive N input signals, and operable to produce the first delay signal, wherein the N input signals include at least one of output capacitance, input sample rate, maximum boost level, load resistance, saturation current, and current limit.

7. The boosted amplifier system of claim 1, wherein the DC-DC boost converter is turned OFF when the audio input signal is lower than the battery voltage.

8. The boosted audio amplifier system of claim 1 further comprising a second digital interpolation filter coupled in series between the programmable delay buffer and the digital to analog converter, the second digital interpolation filter configured to oversample the delayed input signal at a second oversampling rate.

9. The boosted audio amplifier system of claim 2, wherein responsive to the boost control signals the DC-DC converter charges the output capacitor to at least the minimum boost voltage prior to amplification of the first analog signal.

10. The boosted audio amplifier system of claim 1, wherein the first oversampling rate is equal to 2.

11. The boosted audio amplifier system of claim 8, wherein the second oversampling rate is equal to 4.

12. A boosted audio amplifier system comprising:

a first digital interpolation filter configured to oversample an audio input signal at a first oversampling rate;

a signal level detector having an input coupled to receive the oversampled audio input signal and configured to produce an audio input level signal;

a programmable delay buffer having inputs coupled to receive the oversampled audio input signal and a first delay signal and configured to add a first delay to the oversampled audio input signal to produce a delayed input signal;

a first processor having inputs coupled to receive a battery voltage level signal, the audio input level signal and the first delay signal and configured to produce boost control signals to regulate a boost voltage;

a second processor having inputs coupled to receive N input signals and operable to produce the first delay signal;

a second digital interpolation filter having an input coupled to receive the delayed input signal and configured to oversample the delayed input signal at a second oversampling rate;

a digital to analog converter having an input coupled to receive the oversampled signal produced by the second digital interpolation filter and configured to produce a first analog signal; and an amplifier having inputs coupled to receive the regulated boost voltage and the first analog signal and operable to produce an audio output signal.

13. The boosted amplifier system of claim 12 further comprising a DC-DC boost converter having inputs coupled to receive the battery voltage and the boost control signals and operable to regulate the boost voltage.

14. The boosted amplifier system of claim 12 further comprising:

a low pass filter having inputs coupled to receive the boost control signals and configured to filter the boost control signals prior to being applied to the inputs of the DC-DC boost converter; and an output capacitor coupled between an output of the DC-DC boost converter and ground.

15. The boosted audio amplifier system of claim 12, wherein the first processor includes a non-transitory computer-readable medium having program code recorded thereon to execute instructions for a Class-H Control Algorithm to determine the boost control signals.

16. The boosted amplifier system of claim 12, wherein the N input signals include at least one of output capacitance, input sample rate, maximum boost level, load resistance, saturation current, and current limit.

17. The boosted amplifier system of claim 12, wherein the second processor includes a non-transitory computer-readable medium having program code recorded thereon to execute instructions to produce the first delay signal responsive to the N input signals.

18. The boosted audio amplifier system of claim 13, wherein the DC-DC boost converter responsive to the boost control signals maintains the regulated supply voltage at least a minimum boost voltage level required to prevent the audio output signal from being clipped.

19. The boosted audio amplifier system of claim 13, wherein responsive to the boost control signals the duty cycle D of a pulse width modulated (PWM) switching signal applied to the DC-DC boost converter is varied to regulate the boost voltage.

20. A boosted audio amplifier system comprising:

a first digital interpolation filter configured to oversample an audio input signal at a first oversampling rate;

a signal level detector having an input coupled to receive the oversampled audio input signal and configured to produce an audio input level signal;

a programmable delay buffer having inputs coupled to receive the oversampled audio input signal and a first delay signal and configured to add a first delay to the oversampled audio input signal to produce a delayed input signal;

a first processor having inputs coupled to receive a battery voltage level signal, the audio input level signal and the first delay signal and configured to produce boost control signals;

a second processor having inputs coupled to receive N input signals and operable to produce the first delay signal;

a DC-DC boost converter having inputs coupled to receive the battery voltage and the boost control signals and operable to regulate a boost voltage;

a second digital interpolation filter having an input coupled to receive the delayed input signal and configured to oversample the delayed input signal at a second oversampling rate;

a digital to analog converter having an input coupled to receive the oversampled signal produced by the second digital interpolation filter and configured to produce a first analog signal;

an amplifier having inputs coupled to receive the regulated boost voltage and the first analog signal and operable to produce an audio output signal; and an output capacitor coupled between an output of the DC-DC boost converter and ground.

21. The boosted amplifier system of claim 20 further comprising a low pass filter having inputs coupled to receive the boost control signals and configured to filter the boost control signals prior to being applied to the inputs of the DC-DC boost converter.

* * * * *